US007710718B2

(12) United States Patent
Merkin et al.

(10) Patent No.: US 7,710,718 B2
(45) Date of Patent: *May 4, 2010

(54) METHOD AND APPARATUS FOR ENFORCING OF POWER CONTROL IN A BLADE CENTER CHASSIS

(75) Inventors: Aaron E. Merkin, Holly Springs, NC (US); Thomas M. Brey, Cary, NC (US); Joseph E. Bolan, Morrissville, NC (US)

(73) Assignee: International Business Machines Corporation, Armonk, NY (US)

( * ) Notice: Subject to any disclaimer, the term of this patent is extended or adjusted under 35 U.S.C. 154(b) by 89 days.

This patent is subject to a terminal disclaimer.

(21) Appl. No.: 11/859,397

(22) Filed: Sep. 21, 2007

(65) Prior Publication Data

US 2008/0007909 A1 Jan. 10, 2008

Related U.S. Application Data

(63) Continuation of application No. 11/209,868, filed on Aug. 23, 2005, now Pat. No. 7,307,837.

(51) Int. Cl.
*G06F 1/16* (2006.01)
(52) U.S. Cl. .................. 361/679.33; 370/402; 709/238; 713/320
(58) Field of Classification Search ................. 370/216, 370/402; 709/220, 223, 238; 714/12, 55; 361/679–687, 724–727
See application file for complete search history.

(56) References Cited

U.S. PATENT DOCUMENTS

| 7,216,265 | B2 * | 5/2007 | Hughes et al. ................ 714/55 |
| 7,307,837 | B2 * | 12/2007 | Merkin et al. ............... 361/685 |
| 2003/0105984 | A1 | 6/2003 | Masuyama et al. .......... 713/330 |
| 2003/0188222 | A1 | 10/2003 | Abbondanzio et al. ........ 714/12 |
| 2004/0025063 | A1 | 2/2004 | Riley .......................... 713/300 |
| 2004/0025064 | A1 | 2/2004 | Felsman ..................... 713/300 |
| 2004/0064743 | A1 | 4/2004 | Bolian et al. ................ 713/300 |
| 2004/0109406 | A1 | 6/2004 | Rothman et al. ........... 370/216 |
| 2004/0117536 | A1 | 6/2004 | Franke et al. ............... 710/302 |
| 2004/0128562 | A1 | 7/2004 | Bigelow et al. ............. 713/300 |
| 2005/0081074 | A1 | 4/2005 | Chheda et al. .............. 713/320 |
| 2005/0254210 | A1 | 11/2005 | Grady et al. ................ 361/695 |
| 2005/0256942 | A1 | 11/2005 | McCardle et al. ........... 709/220 |
| 2009/0031014 | A1 * | 1/2009 | Chu et al. ................... 709/222 |

* cited by examiner

*Primary Examiner*—Hung V Duong
(74) *Attorney, Agent, or Firm*—Winstead, P.C.

(57) ABSTRACT

A mechanism for changing ownership over the physical power to a blade server in a blade center chassis that prevents a malfunctioning blade from jeopardizing other components in the chassis. When the management module is not present, control over power to the blade is switched to a service processor on the blade. This arbitration of control over power to a blade is accomplished by implementing a watchdog timer mechanism. The management module is responsible for tickling the watchdog timer when the present in the chassis and operating normally. This mechanism provides the management module with control over power. If the management module malfunctions or is removed, control over power is switched to the local service processor on the blade server as soon as the watchdog timer is not tickled.

12 Claims, 9 Drawing Sheets

METHOD AND APPARATUS FOR ENFORCING OF POWER CONTROL IN A BLADE CENTER CHASSIS

CROSS REFERENCE TO RELATED APPLICATIONS

The present application is a continuation application of pending U.S. patent application Ser. No. 11/209,868, which was filed on Aug. 23, 2005, which is assigned to the assignee of the present invention. The present application claims priority benefits to U.S. patent application Ser. No. 11/209,868.

TECHNICAL FIELD

The present invention relates in general to data processing systems, and in particular, to communications network devices referred to as blade servers.

BACKGROUND INFORMATION

The use of servers as devices within communications networks is well known in the art. A server is equipment that makes available file, database, printing, facsimile, communications or other services to client terminals/stations with access to the network the server serves. When the server permits client/terminal station access to external communications network it is sometimes known as a gateway Servers are available in different sizes, shapes and varieties. Servers may be distributed throughout a network or they may be concentrated in centralized data centers.

Advances in centralized data processing centers have resulted in smaller form factors for server devices and an increase in the density of processing units, thereby reducing space requirements for computing infrastructure. One common form factor has been termed in the art a "blade server," comprising a device built for vertically inserting into a chassis that can house multiple devices that share power and other connections over a common backplane, i.e., a blade center. Slim, hot swappable blade servers (also referred to herein as "blades") fit in a single chassis like books in a bookshelf—and each is an independent server, with its own processors, memory, storage, network controllers, operating system and applications. The blade server slides into a bay in the chassis and plugs into a mid- or backplane, sharing power, fans, floppy drives, switches, and ports with other blade servers. The benefits of the blade approach will be readily apparent to anyone tasked with running down hundreds of cables strung through racks just to add and remove servers. With switches and power units shared, precious space is freed up—and blade servers enable higher density with far greater ease. With a large number of high-performance server blades in a single chassis, blade technology achieves high levels of density.

Even though power consumption and device complexity per unit of processing power may actually decrease with a blade center, since the physical density of the computing devices has increased, the demands on power consumption for processing power and cooling have also intensified as overall computing power has increased. A blade center chassis has resources such as power and cooling that are shared by multiple components in the enclosure. A management module is present in each chassis which is responsible for managing all components within a chassis and the relationship between them. Each blade is allocated a fixed amount of power or cooling capacity. If any blade exceeds its allocation, it can force the entire chassis to exceed threshold values, which can, in turn, force the common power supply to shut down, causing other blades to be turned off. Another risk is that any blade exceeding its allocation can cause other blades to shut down due to temperatures exceeding their critical thresholds.

Probably, one of the most pressing problems associated with servers is manageability and particularly manageability as applied to chassis mounted servers. One aspect of manageability within this type of server relates to allocating power resources, which has been solved by system architecture in past configurations. Service processors on blades are required to ask the management module for permission to power on and to shut down when requested by the management module. In such a configuration, the blade server continues to maintain control over its own power consumption. In past system architectures, this feature has been preserved so that blade servers can continue to operate in an environment where the management module is not present. While past architectures have thusly addressed the majority of cases, they have not addressed the case where a blade server malfunctions, i.e., does not properly respond to the directives of the management module. Therefore, past blade center system architectures have been susceptible to the malfunction of a single blade that does not follow the required protocol for power management, for example, by choosing to power on in inappropriate situations, thereby jeopardizing the operation of other blades in the chassis.

In view of the above problems a more reliable system and method is needed to enforce power control in a blade center chassis to prevent overloading of power and cooling resources due to a non-compliant, malfunctioning blade server.

SUMMARY OF THE INVENTION

The present invention addresses the foregoing need by providing a mechanism for changing ownership over the physical power to the blade. When a management module is present, it will maintain control over the power to the blade. When the management module is not present, control over power to the blade is switched to the service processor on the blade. This arbitration of control over power to a blade is accomplished by implementing a watchdog timer mechanism between the management module and the switch controlling power to the blade. The management module is responsible for tickling, i.e., continuously triggering at discrete intervals, the watchdog timer when the management module is present in the chassis and is operating normally. This mechanism provides the management module with control over power. If the management module malfunctions or is removed, control over power is switched to the local service processor as soon as the watchdog timer is not tickled by the management module.

An object of the present invention is to provide a mechanism for controlling the power to a blade server in a blade center, whereby the control of the power is retained by a management module when present in the blade center chassis.

Another object of the present invention is to prevent blade servers that malfunction or that are defective and thus, do not adhere to the architecture protocol for power control from powering on in a blade center chassis.

Another object of the present invention is to force malfunctioning blade servers to power off when directed by the management module.

Thus, another object of the present invention is to protect blade servers in a blade center chassis from the adverse effects of a malfunctioning or defective blade server, such as total loss of power in the blade center chassis due to overloading the common power supply or from exposure to excessive thermal loading.

Still another object of the present invention is to provide for the secure and reliable operation of blade servers in a blade center chassis by providing fault-tolerance for the adverse effects of a malfunctioning or defective blade server, such as overloading the common power supply or excessive thermal loading.

Another object of the present invention is to provide a means whereby power can be individually switched to blades occupying the slots of a blade center chassis.

Yet another object of the present invention is to provide a watchdog timer mechanism that can revert control over power switching to an individual blade server when the management module is not present or does not respond when queried.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
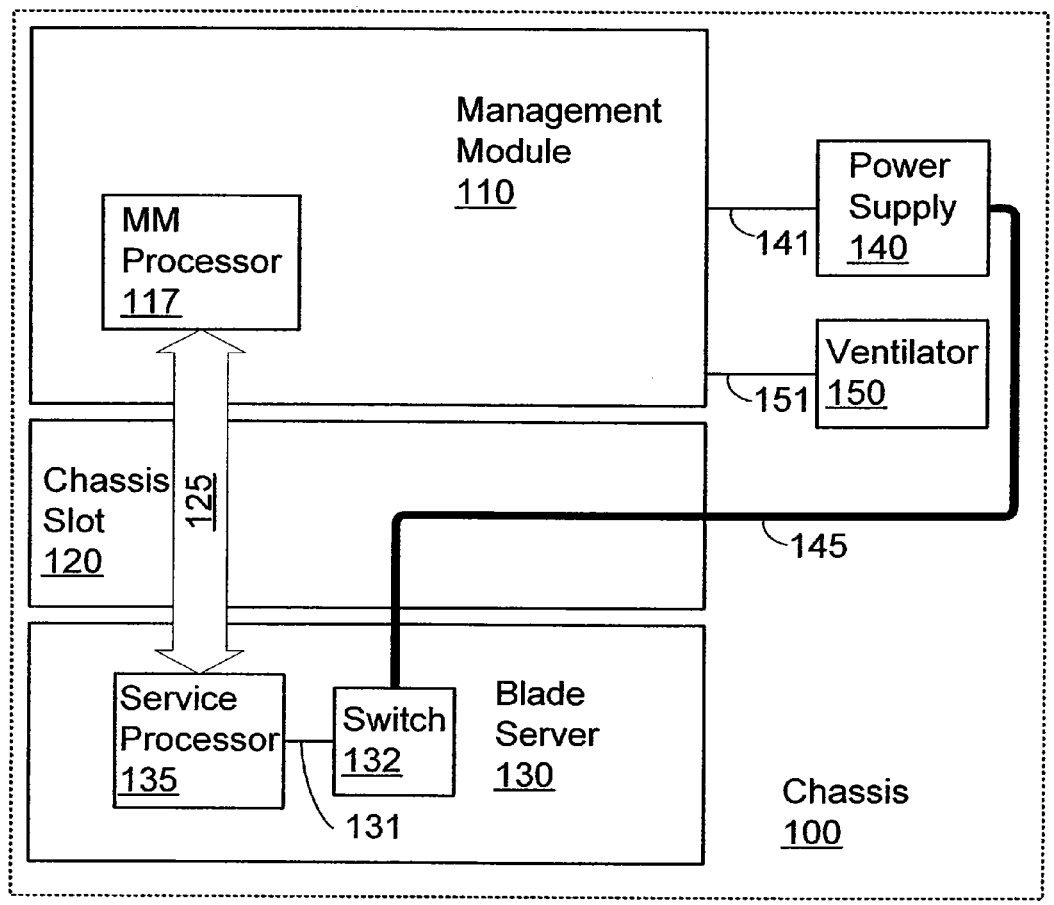
FIG. 1 illustrates a prior art embodiment of system components in a blade center.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 4:
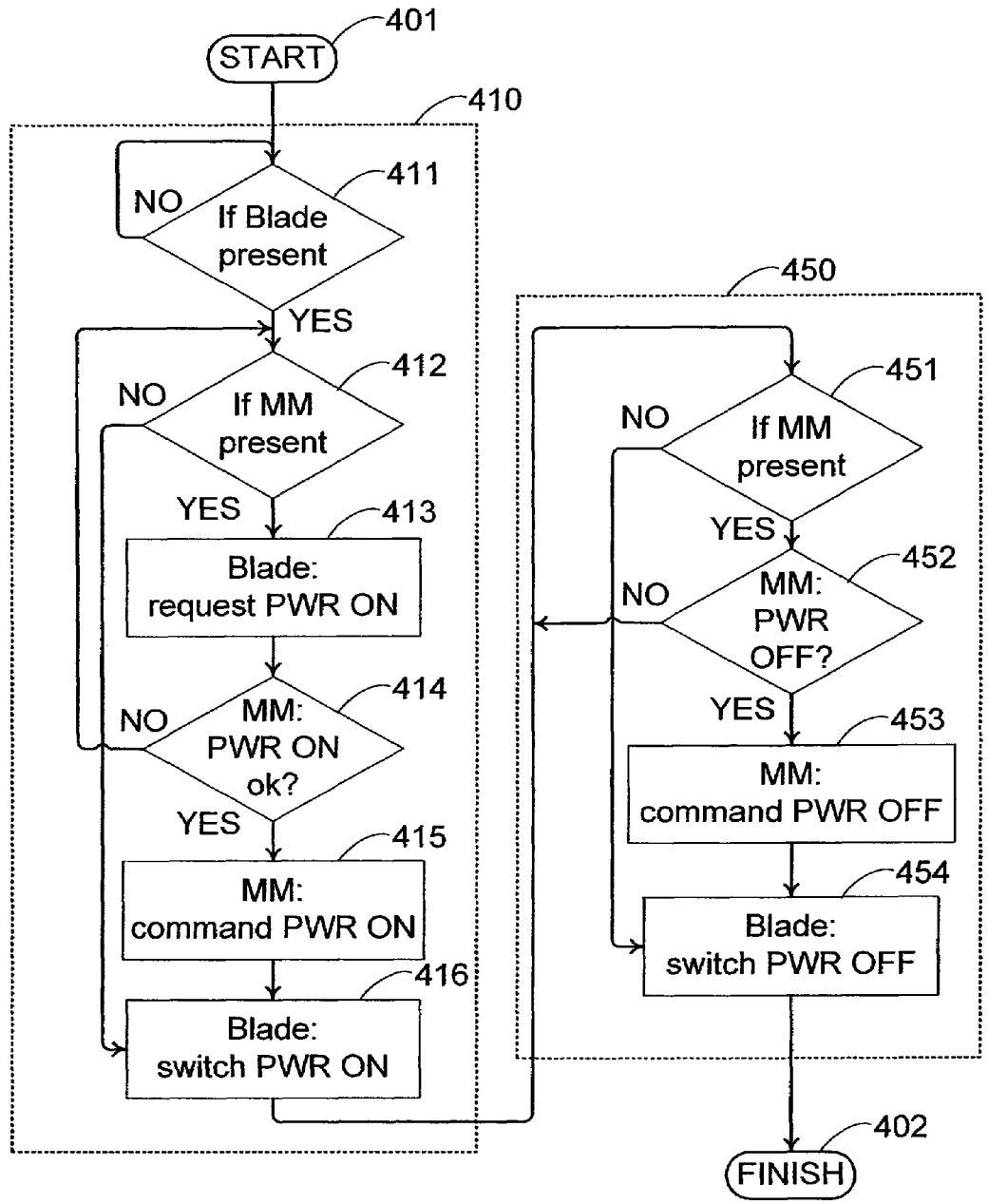
FIG. 4 is a flow chart of a prior art power cycle process.

The prior art system components and architecture for controlling power in a blade center chassis are illustrated in FIGS. 1 and 4 respectively. Referring to FIG. 1, a blade center chassis 100 contains the following components relevant for controlling power: blade servers 130 which reside in the chassis slots 120; management modules (MM) 110 which may contain their own MM processor 117; a common power supply 140 and ventilators 150; and communication interfaces between these components 125, 141, 151, 131. In a typical prior art system, the service processor (SP) 135 on a blade 130 is required to ask, via the bidirectional interface 125, the MM processor 117 on the MM 110 for permission to power on and to shut down when requested by the MM 110. In this architecture, the common power supply 140 is routed via the power bus 145 to all slots 120 in the chassis 100. There is no mechanism for the MM 110 to directly constrain power to an individual blade 130. The MM 110 controls the common power supply 140 via bus 141 and the ventilator 150 via a fan bus 151. The bidirectional interface 125 between the MM processor 117 and the SP 135, may be a multi-drop RS-485 interface. Other interface protocols for 125 may be implemented. The control buses 141, 151, 131 may be I²C interfaces.

In FIG. 4, the operation of the prior art system in FIG. 1 is illustrated with an example of a power on process 410 and a power off process 450 for a server blade 130 in a chassis slot 120 of a blade center chassis 100. In the power on process 410, no action is taken until a blade 130 is present 411. If no MM 110 is present 412, the blade 130 powers on 416 without external control. If an MM 110 is present, then the blade 130 is required to request permission 413 from the MM 110 to power on. The MM 110 is responsible for deciding 414 if the blade 130 can power on. The MM 110 will follow whatever rules are in effect that determine whether the power operation should proceed. If the MM 110 decides to deny the power on request, the blade 130 may repeat the request 413 in a timely manner for reconsideration. If the MM 110 allows the power on request 413, the MM 110 issues a power on command 415 to the blade 130, upon which the blade is permitted to power on 416.

Noteworthy in the prior art case is that the blade 130 remains in physical and logical control of the power on 416, which is executed by the SP 135 issuing a command on the bus 131 for the switch module 132 to switch on power 145 from the common power supply 140 to the blade 130. Physical control refers to controlling the actuator stage providing electrical power connections, for example, providing current to a relay coil that closes a power relay switch. Logical control refers to issuing the command to activate power connections, thereby controlling the policy and the timing of the decision to supply power. In one example, logical control may be asserted with a digital control signal, such as a static 12V DC digital output. In another embodiment, logical control may be primarily asserted by sending a binary command to a control unit, which then executes further logical control in direct response to the binary command. In further examples, the binary command may be sent bitwise in parallel or serially, using an appropriate interface and driver. Important to note is that logical control may be transferred with logic circuitry or by circuitry responsive to software commands. Transfer of physical control will generally involve rerouting a control path for switching electrical power.

Also important is that in this prior art architecture, the blade 130 may malfunction and ignore the commands via interface 125 from the MM 110, 117 or may violate the architecture protocol 410 at any time. Such an error mode presents significant risks for the other blades in the chassis, particularly for the case of a malfunctioning blade 130 powering on 416. This kind of non-compliance by a blade can cause the power consumption to exceed threshold values, which can cause loss of power to the entire blade center chassis 100. Alternatively, a malfunctioning blade can cause other blades to shut down due to temperatures exceeding their threshold values. The efforts of the MM 110 to maintain power and temperature in the blade chassis 100 within threshold values may be therefore undermined by a single malfunctioning blade 130.

A prior art power off process is illustrated in 450. If no MM is present 451 then the blade may directly switch off 454 at any time. If the MM is present 451, the system stays in the power on state until the MM decides 452 to issue a power off command 453. In other examples, the MM may respond to external input, such as a power switch or shut down command, in deciding to power off 452. Once the blade has received the power off command 453 from the MM, it must switch itself off 454. Note that the malfunctioning of a blade 130 in this case 450 may be the refusal to power off 453, which carries all the same negative implications for resource management mentioned above for case 410. Since the MM processor 117 does not have physical control over the circuitry for switching power to the blade 132 or logical control over the SP 135, the efforts of the MM 110 for managing power and temperature are also undermined by a malfunctioning blade 130 when it refuses to power off 454.

Figure 2:
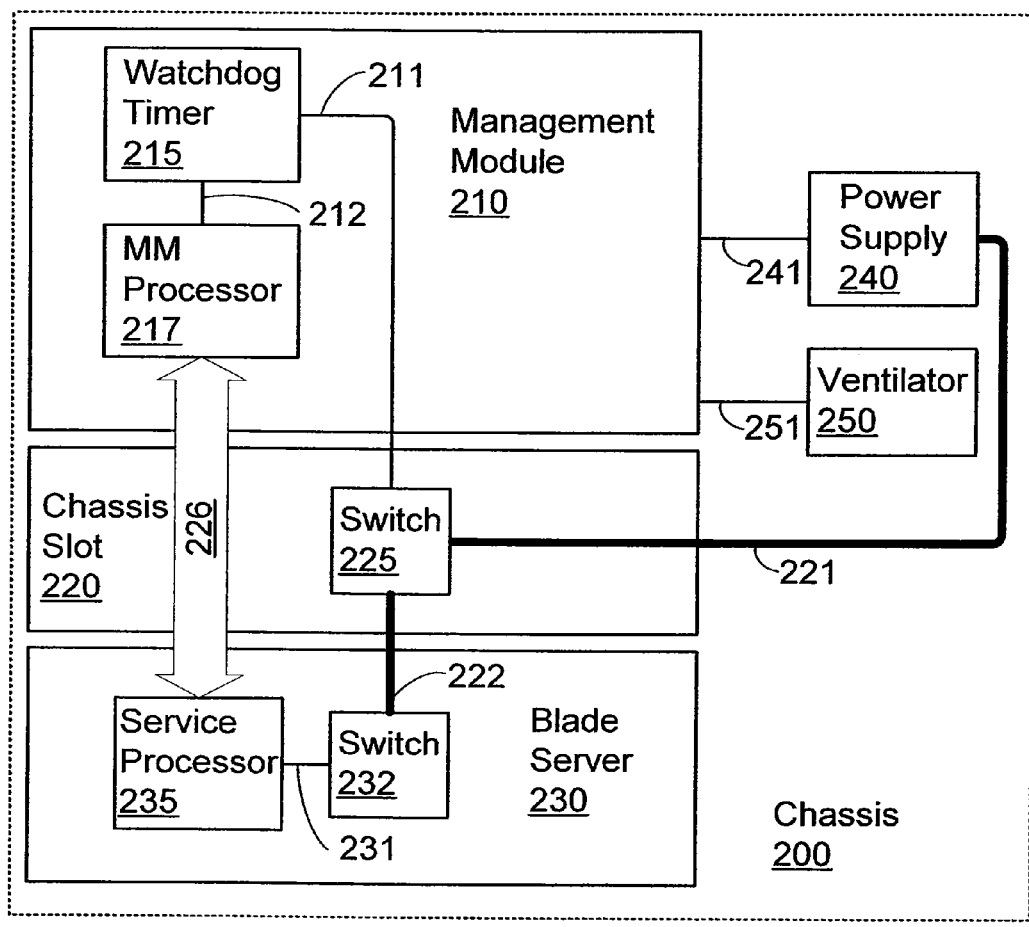
FIG. 2 illustrates system components in one embodiment of the present invention.

The present invention provides a mechanism for changing ownership over the physical power to the blade. In FIG. 2, a hardware configuration of an embodiment of the present invention is illustrated. The SP 235 on the blade 230 maintains an interface 231 to a switch module 232 on the blade server 230. However, the power bus interface 222 from the blade 230 is routed through an additional control switch 225 located on a chassis slot 220 modified for this purpose. Each chassis slot 220 in the chassis 200 contains an additional switch module 225 for individually switching power 221 from the common power supply 240 to a blade 230. The SP 235 communicates with the MM processor 217 via the interface 226. A modified MM 210 contains a watchdog timer module 215, which may be tickled via bus 212 by the MM processor 217. The watchdog timer 215 may assert control of the chassis slot control switch 225 via bus interface 211. If for any reason the MM 210 does not respond or is not present, the watchdog timer 215 releases control of switch 225, in one example by closing the switch, while concurrently a timeout in interface 226 is registered by SP 235, which responds by reasserting local control over switch 232 via interface 231. Noteworthy in the hardware configuration of FIG. 2 is that the blade 230 can be forced to comply with the decisions of the MM 210 in its efforts to manage power and temperature in the chassis 200, leaving no possibility of a blade 330 malfunctioning and endangering the other equipment in the chassis 200.

Figure 3:
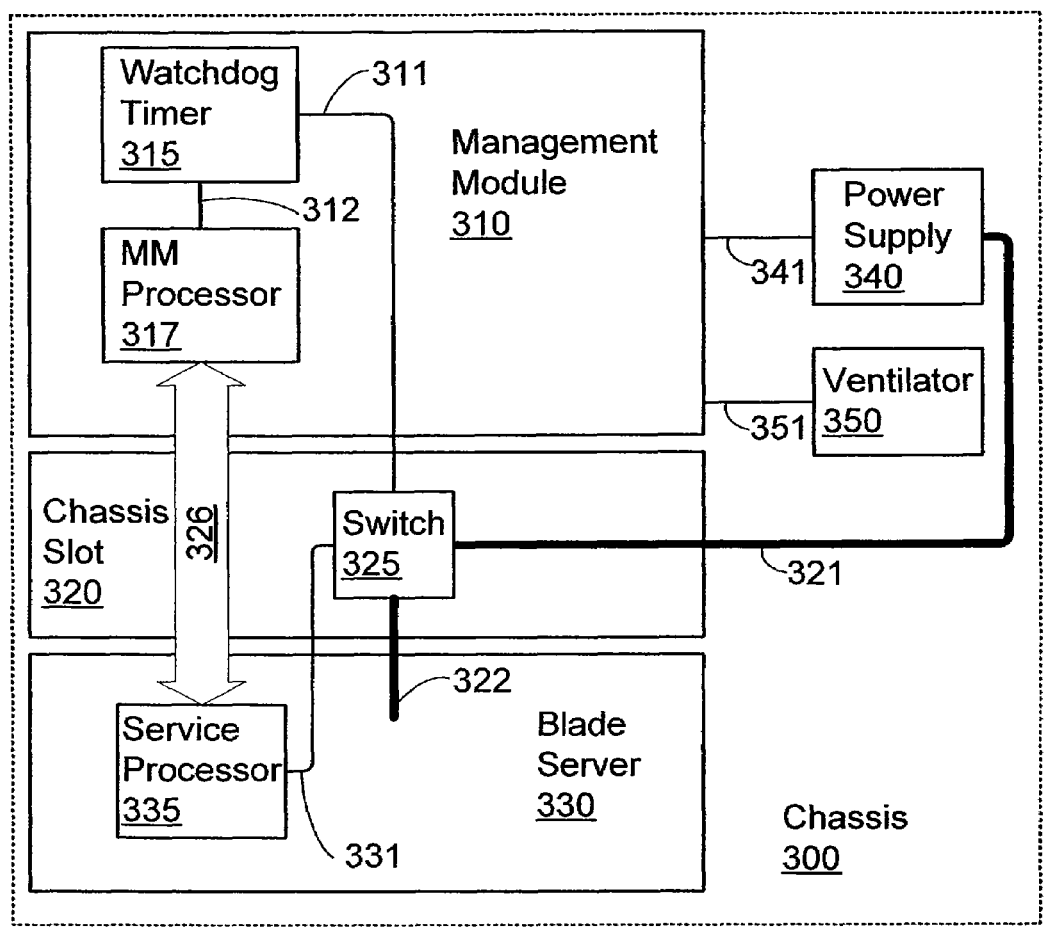
FIG. 3 illustrates system components in one embodiment of the present invention.

In FIG. 3, an alternative embodiment of a hardware configuration of the present invention is illustrated. The SP 335 on the blade 330 maintains an interface 331 to a switch module 325 in the chassis slot 320, which has been modified accordingly. The power bus interface 322 from the blade 330 is routed directly through a control switch 325; blade 330 no longer requires its own power switching circuitry. Each chassis slot 320 in the chassis 300 contains a switch module 325 for individually switching power 321 from the common power supply 340 directly to a blade 330. The SP 335 communicates with the MM processor 317 via the interface 326. A modified MM 310 contains a watchdog timer module 315, which may be tickled via bus 312 by the MM processor 317. The watchdog timer 315 may assert control of the chassis slot control switch 325 via bus interface 311. If for any reason the MM does not respond or is not present, the watchdog timer 315 releases control of switch 325, while concurrently a timeout in interface 326 is registered by SP 335, which responds by reasserting control over switch 325 via interface 331. Noteworthy in the hardware configuration of FIG. 3 is that the blade 330 can be forced to comply with the decisions of the MM 310 in its efforts to manage power and temperature in the chassis 300, leaving no possibility of a blade 330 malfunctioning and endangering the other equipment in the chassis 300.

Figure 5:
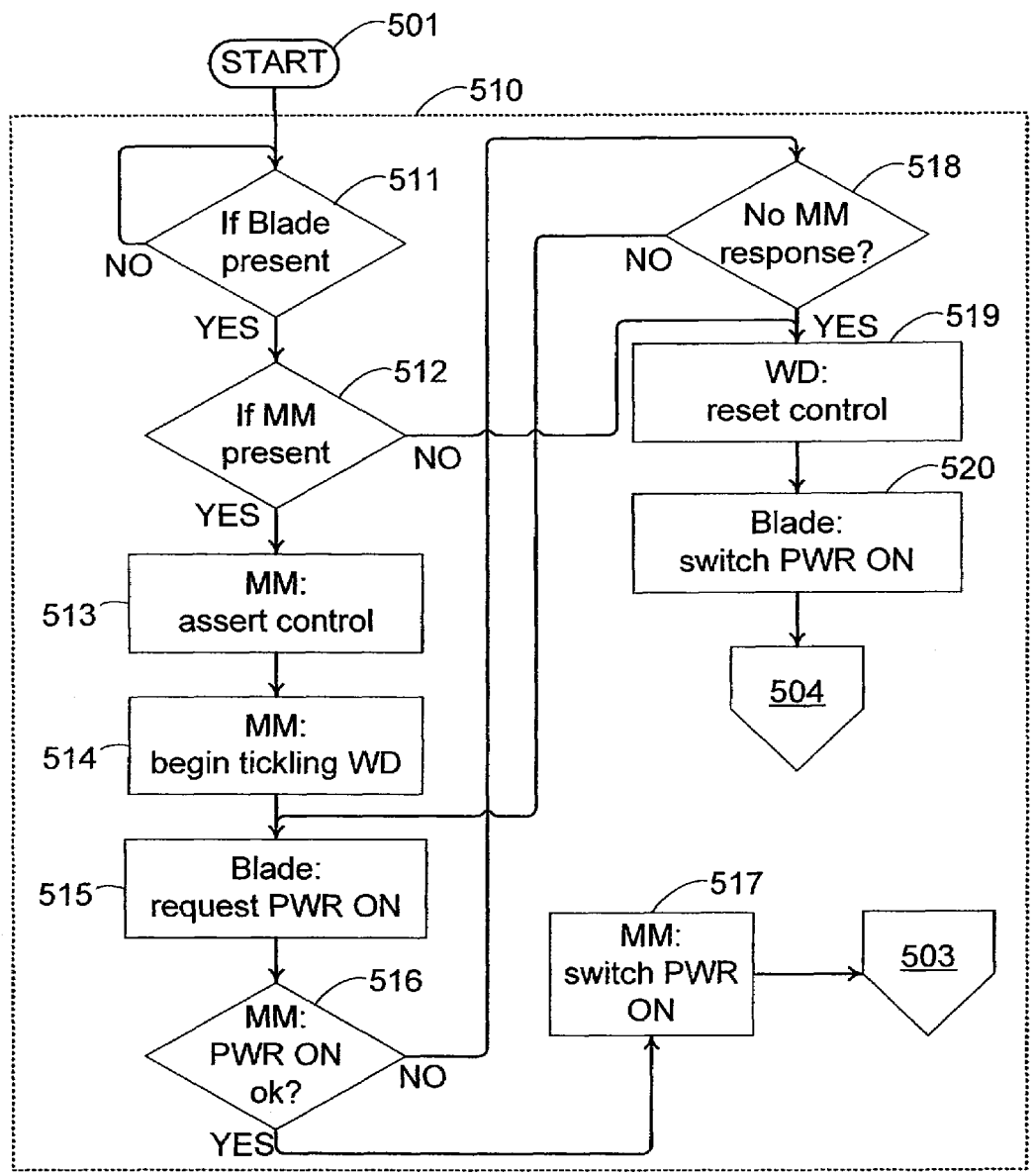
FIG. 5 is a flow chart of a power on portion of a power cycle process in one embodiment of the present invention.

FIG. 5 illustrates a power on portion 510 of a power cycle process in one embodiment of the present invention. When a MM 210, 310 is present, it will assert control 513 over the power 221 to the blade 230, 330. In one example MM 210 asserts control by commanding the SP 235 via interface 226 not to operate switch 232. In another example, the MM 310 asserts control by commanding the SP 335 via interface 326 not to operate switch 325 and through watchdog timer 315, which enforces control of 325 via interface 311. In another example, the MM 210 asserts control by forcing switch 232 to close while switch 225 is initially open. Other mechanisms for asserting physical or logical control over power to the blade may by MM 210 or 310 may be practiced in embodiments of the present invention. After asserting control, the MM processor 217, 317 begins tickling 514 the watchdog timer 215, 315 via interface 212, 312. Tickling involves sending trigger pulses or messages with a predefined interval to the watchdog timer 215, 315. Other configurations of the watchdog timer 215, 315 may be practiced within the scope of the present invention, such as direct monitoring of communication 226, 326, or installing the watchdog timer 215, 315 on the chassis slot 220, 320. While the watchdog timer 215, 315 is tickled, the blade 230, 330 may request 515 power on from the MM 210, 310. The MM 210, 310 may decide 516 to power on the blade 230, 330, and then, in one example of the present invention, switches power on 517 via switch module 225, 325. The MM may decide not 516 to power on the blade 230, 330, and as long as the MM 210, 310 is alive and responding 518, the blade may continue to issue another power on request 515, since the blade 230, 330 does not have control over the power switch 225, 325 as long as the watchdog timer 215, 315 is tickled. If the MM 210, 310 stops 518 tickling the watchdog timer 215, 315, the watchdog timer 215, 315 resets control 519 to the power switch 225, 325 via bus 211, 311 to the SP 235, 335. At such time, the blade 230, 330 may then switch power on 520.

Figure 6:
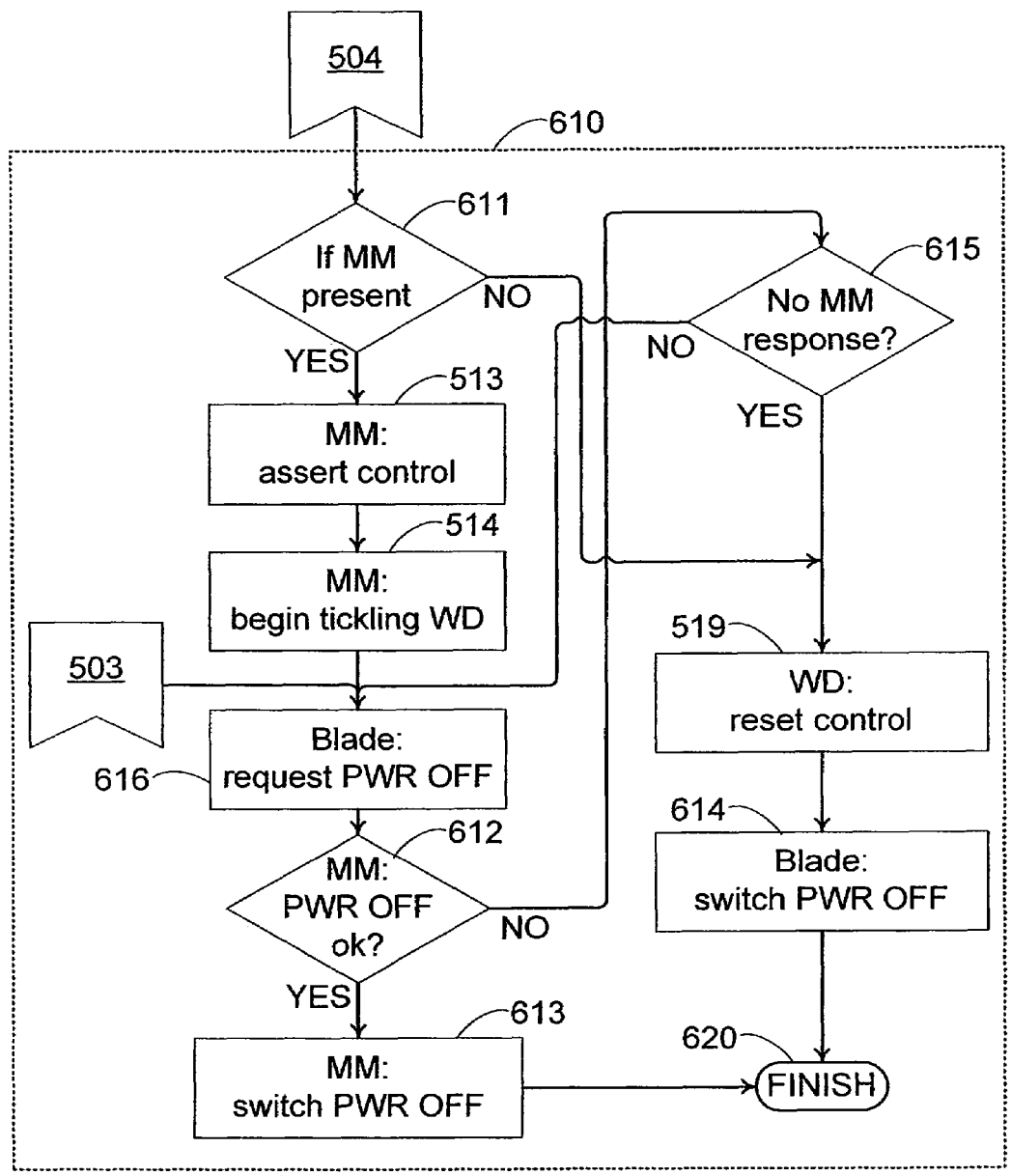
FIG. 6 is a flow chart of a power off portion of a power cycle process in one embodiment of the present invention.

FIG. 6 illustrates a power off portion 610 of a power cycle process in one embodiment of the present invention. Note that the power on state may be attained either under control of the MM 210, 310, in which case 503 represents the continuation path of the process, or under control of the SP 235, 335, in which case 504 represents the continuation path of the process. If the blade 230, 330 was powered on 520 by the SP 235, 335, via 504, then if the MM 210, 310 is inserted 611, the MM 210, 310 asserts control 513 and begins tickling 514 the watchdog timer 215, 315. If the MM 210, 310 is not inserted, then the control remains with the SP 235, 335, and the blade 230, 330 may switch itself off 614. If the MM 210, 310 is present and is tickling the watchdog timer 215, 315, path 503 represents the power on state of the blade 230, 300 until the blade issues a power off request 616. If the MM 210, 310 decides to power off 613 the blade 230, 330, then the MM 210, 310 may power off 613 the blade by opening switch 225, 325 and interrupting the power bus 221 to the blade's chassis slot 220, 320. Other subsidiary mechanisms for executing the power off 613 may be implemented in other embodiments of the present invention, such as instructing SP 235 to physically power off switch 232 via bus 231 or instructing SP 335 to physically power off switch 325 via bus 331. However, the MM 210, 310 always maintains overriding physical and logical control of switch 225, 325 to enforce power policy in case the blade 230, 330 malfunctions. If the MM 210, 310 decides not 612 to power off the blade 230, 330 and the MM 210, 310 continues to tickle the watchdog timer 615, the blade has no other option but to issue another request to power off. If the MM 210, 310 stops 615 tickling the watchdog timer 215, 315, the watchdog timer 215, 315 resets control 519 to the power switch 225, 325 via bus 211, 311 to the SP 235, 335. At such time the blade 230, 330 may then switch power off 614. In the power off state, a remedial power supply sufficient for operating the SP 235, 335 and other necessary control circuitry on the blade 230, 330 is not precluded by the chassis slot 220, 320.

Figure 7:
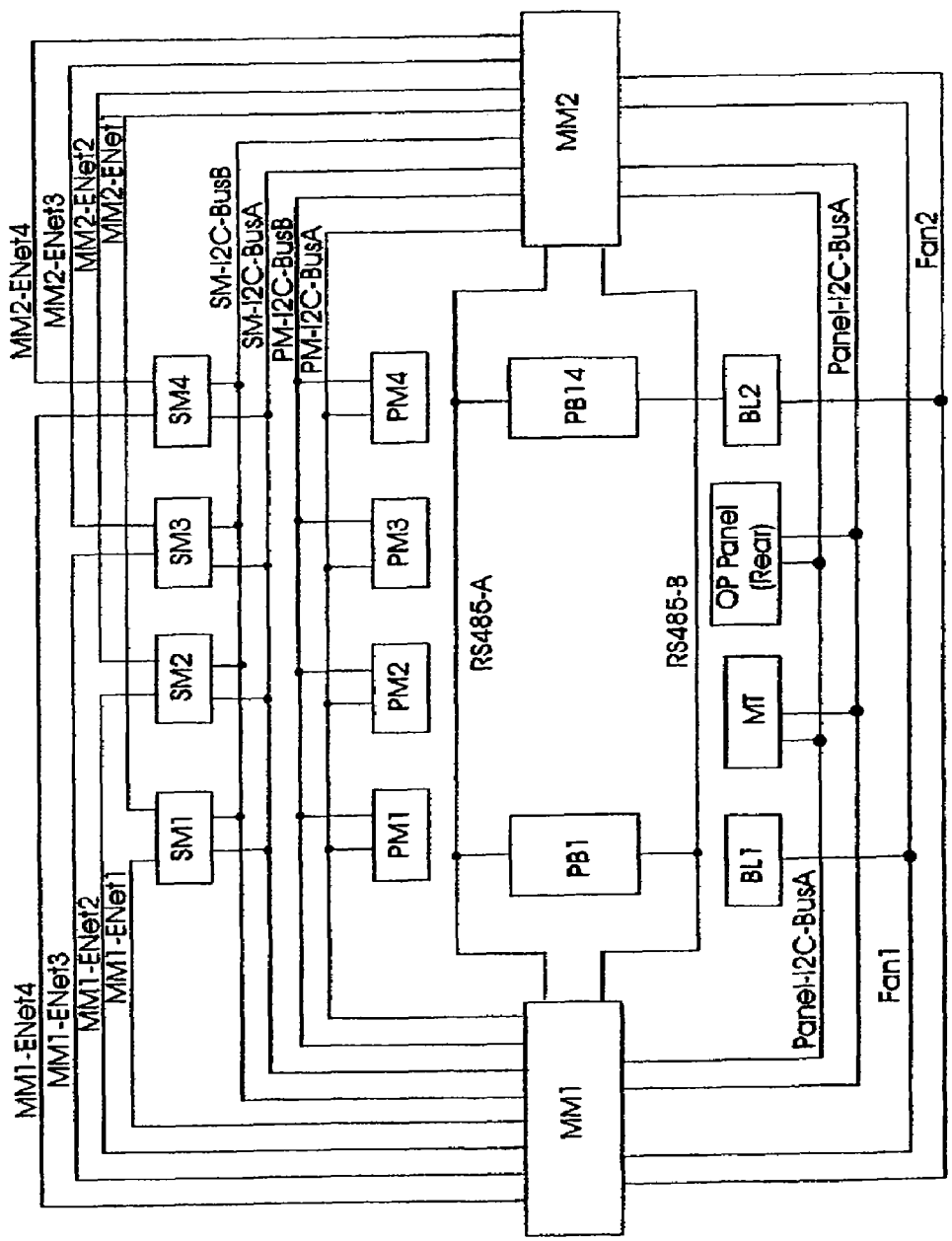
FIG. 7 illustrates a schematic diagram of a blade center management subsystem.

FIG. 7 is a schematic diagram of a blade center chassis management subsystem, showing engineering details of the individual management modules MM1-MM4, previously represented schematically by MM 210, 310, and showing engineering details of the individual components contained in previous schematic representations of blade center chassis 200, 300. Referring to this figure, each management module has a separate Ethernet link to each one of the switch modules SM1 through SM4. Thus, management module MM1 is linked to switch modules SM1 through SM4 via Ethernet links MM1-ENet1 through MM1-ENet4, and management module MM2 is linked to the switch modules via Ethernet links MM2-ENet1 through MM2-ENet4. In addition, the management modules are also coupled to the switch modules via two well known serial $I^2C$ buses SM-$I^2C$-BusA and SM-$I^2C$-BusB, which provide for "out-of-band" communication between the management modules and the switch modules. Similarly, the management modules are also coupled to the power modules (previously represented schematically by 240, 340) PM1 through PM4 via two serial $I^2C$ buses (corresponding to interfaces 241, 341) PM-$I^2C$-BusA and PM-$I^2C$-BusB. Two more $I^2C$ buses Panel-$I^2C$-BusA and Panel-$I^2C$-BusB are coupled to media tray MT and the rear panel. Blowers BL1 and BL2 (previously represented schematically by 250, 350) are controlled over separate serial buses Fan1 and Fan2 (corresponding to interfaces 251, 351). Two well known RS485 serial buses RS485-A and RS485-B (corresponding to interfaces 226, 326) are coupled to server blades PB1 through PB14 for "out-of-band" communication between the management modules and the server blades.

Figure 8:
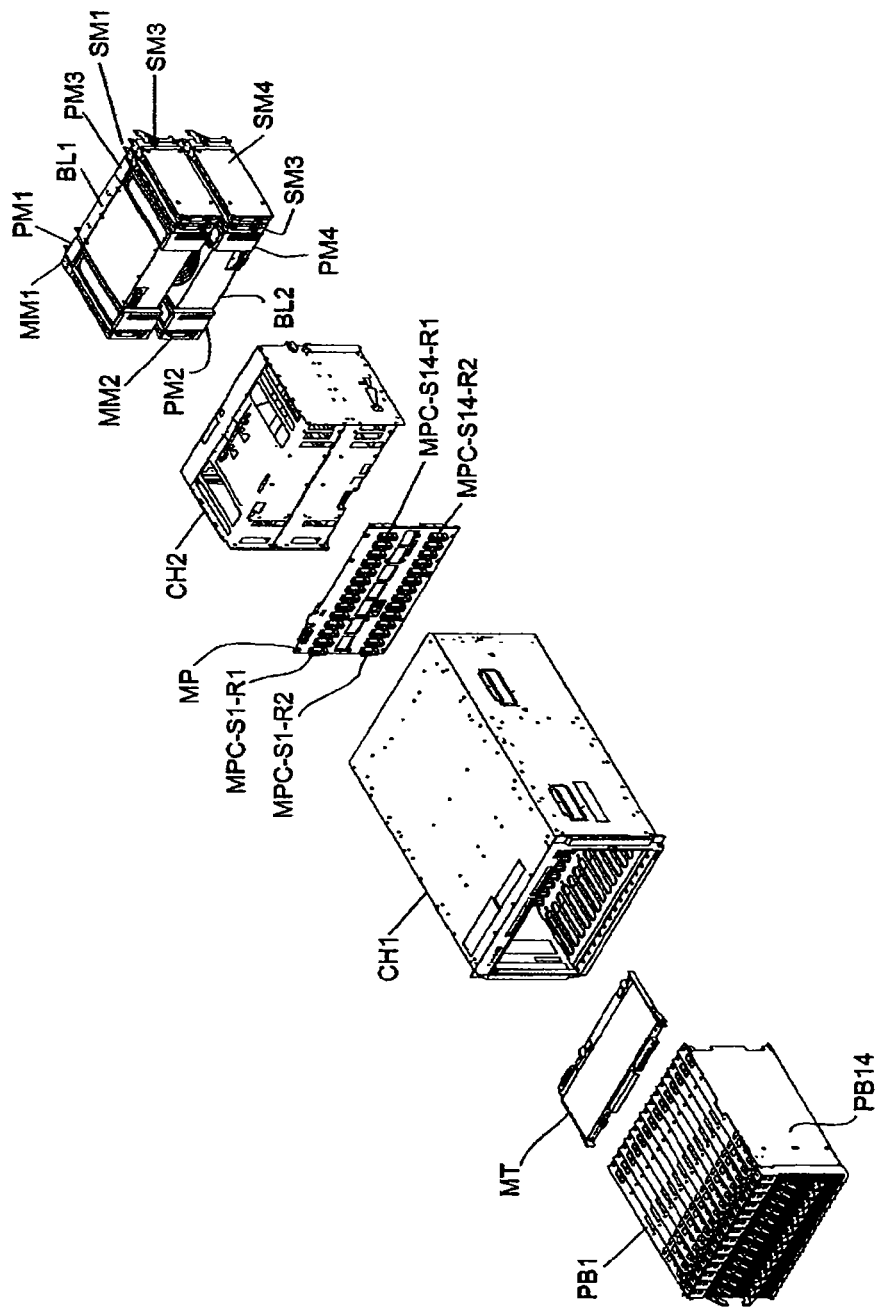
FIG. 8 illustrates a front, top and right side exploded perspective view of a blade center chassis in accordance with an embodiment of the present invention.

FIG. 8 illustrates a front, top and right side exploded perspective view of a server blade system, showing engineering details of the individual components contained in previous schematic representations of blade center chassis 200, 300. Referring to this figure, main chassis CH1 houses all the components of the server blade system. Up to 14 processor blades PB1 through PB14 (or other blades, such as storage blades) are hot pluggable into the 14 slots in the front of chassis CH1. The term "server blade", "blade server", "processor blade", or simply "blade" is used throughout the specification and claims, but it should be understood that these terms are not limited to blades that only perform "processor" or "server" functions, but also include blades that perform other functions, such as storage blades, which typically include hard disk drives and whose primary function is data storage.

Processor blades provide the processor, memory, hard disk storage and firmware of an industry standard server. In addition, they include keyboard, video and mouse ("KVM") selection via a control panel, an onboard service processor, and access to the floppy and CD-ROM drives in the media tray. A daughter card may be connected via an onboard PCI-X interface and is used to provide additional high-speed links to various modules. Each processor blade also has a front panel with 5 LED's to indicate current status, plus four push-button switches for power on/off, selection of processor blade, reset, and NMI for core dumps for local control.

Blades may be "hot swapped" without affecting the operation of other blades in the system. A server blade is typically implemented as a single slot card (394 mm×227 mm); however, in some cases a single processor blade may require two slots. A processor blade can use any microprocessor technology as long as it is compliant with the mechanical and electrical interfaces, and the power and cooling requirements of the server blade system.

For redundancy, processor blades have two signal and power connectors; one connected to the upper connector of the corresponding slot of midplane MP (described below), and the other connected to the corresponding lower connector of the midplane. Processor Blades interface with other components in the server blade system via midplane interfaces comprising: 1) Gigabit Ethernet; 2) Fiber Channel; 3) management module serial link; 4) VGA analog video link; 4) keyboard/mouse USB link; 5) CD-ROM and floppy disk drive ("FDD") USB link; 6) 12 VDC power; and 7) miscellaneous control signals. These interfaces provide the ability to communicate with other components in the server blade system such as management modules, switch modules, the CD-ROM and the FDD. These interfaces are duplicated on the midplane to provide redundancy. A processor blade typically supports booting from the media tray CDROM or FDD, the network (Fiber channel or Ethernet), or its local hard disk drive.

A media tray MT includes a floppy disk drive and a CD-ROM drive that can be coupled to any one of the 14 blades. The media tray also houses an interface board on which is mounted interface LED's, a thermistor for measuring inlet air temperature, and a 4-port USB controller hub. System level interface controls consist of power, location, over temperature, information, and general fault LED's and a USB port.

Midplane circuit board MP is positioned approximately in the middle of chassis CH1 and includes two rows of connectors; the top row including connectors MPC-S1-R1 through MPC-S14-R1, and the bottom row including connectors MPC-S1-R2 through MPC-S14-R2. Thus, each one of the 14 slots includes one pair of midplane connectors located one above the other (e.g., connectors MPC-S1-R1 and MPC-S1-R2) and each pair of midplane connectors mates to a pair of connectors at the rear edge of each processor blade (not visible in FIG. 8).

Figure 9:
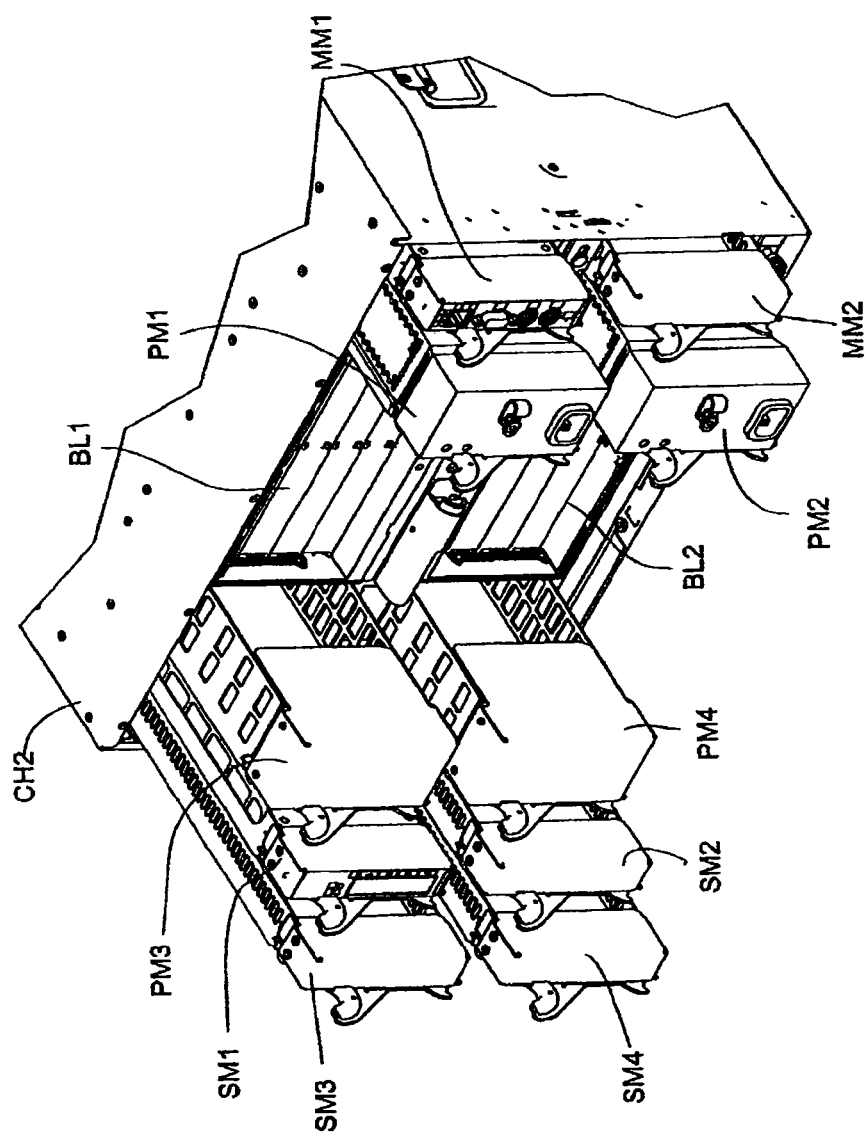
FIG. 9 illustrates a rear, top and left side perspective view of the rear portion of a blade center chassis in accordance with an embodiment of the present invention.

FIG. 9 is a rear, top and left side perspective view of the rear portion of the server blade system. Referring to FIGS. 8 and 9, a chassis CH2 houses various hot pluggable components for cooling, power, control and switching. Chassis CH2 slides and latches into the rear of main chassis CH1.

Two hot pluggable blowers BL1 and BL2 (previously represented schematically by 250, 350) include backward-curved impeller blowers and provide redundant cooling to the server blade system components. Airflow is from the front to the rear of chassis CH1. Each of the processor blades PB1 through PB14 includes a front grille to admit air, and low-profile vapor chamber based heat sinks are used to cool the processors within the blades. Total airflow through the system chassis is about 300 CFM at 0.7 inches $H_2O$ static pressure drop. In the event of blower failure or removal, the speed of the remaining blower automatically increases to maintain the required air flow until the replacement unit is installed. Blower speed control is also controlled via a thermistor that constantly monitors inlet air temperature. The temperature of the server blade system components are also monitored and blower speed will increase automatically in response to rising temperature levels as reported by the various temperature sensors.

Four hot pluggable power modules PM1 through PM4 (previously represented schematically by 240, 340) provide DC operating voltages for the processor blades and other components. One pair of power modules provides power to all the management modules and switch modules, plus any blades that are plugged into slots 1-6. The other pair of power modules provides power to any blades in slots 7-14. Within each pair of power modules, one power module acts as a backup for the other in the event the first power module fails or is removed. Thus, a minimum of two active power modules are required to power a fully featured and configured chassis loaded with 14 processor blades, 4 switch modules, 2 blowers, and 2 management modules 210. However, four power modules are needed to provide full redundancy and backup capability. The power modules are designed for operation between an AC input voltage range of 200 VAC to 240 VAC at 50/60 Hz and use an IEC 320 C14 male appliance coupler. The power modules provide +12 VDC output to the midplane from which all server blade system components get their power. Two +12 VDC midplane power buses are used for redundancy and active current sharing of the output load between redundant power modules is performed.

Management modules MM1 through MM4 (previously represented schematically by 210, 310) are hot-pluggable components that provide basic management functions such as controlling, monitoring, alerting, restarting and diagnostics. Referring to FIGS. 2 and 3, the management modules 210, 310 contain the MM Processor 217, 317 and the watchdog timer 215, 315 with its interface 211, 311 to the individual switch module 225, 325 in embodiments of the present invention. Management modules also provide other functions required to manage shared resources, such as the ability to switch the common keyboard, video, and mouse signals among processor blades.

Although the present invention and its advantages have been described in detail, it should be understood that various changes, substitutions and alterations can be made herein without departing from the spirit and scope of the invention as defined by the appended claims.

What is claimed is:

1. A method for controlling a supply of power to a blade server in a blade center chassis, wherein a management module is installed in said blade center chassis, comprising the step of:
    transferring to said management module physical and logical control of electrical power connections switched to a blade server populating a chassis slot of said blade center chassis.

2. The method as recited in claim 1, further comprising the step of:
    activating a watchdog timer tickled by said management module.

3. The method as recited in claim 1, wherein said transferring of physical and logical control to said management module further comprises the steps of:
    said management module communicating bidirectionally with a service processor located on said blade server;
    said service processor relinquishing to said management module said control over power switching circuitry located on said blade server; and
    said management module asserting said control over power switching circuitry located in said chassis for switching power to the individual chassis slot populated by said blade server.

4. The method as recited in claim 3, further comprising the step of:
    said management module forcing the power switching circuitry located on said blade server to close.

5. The method as recited in claim 3, further comprising the step of:
    said service processor relinquishing to said management module said control over power switching circuitry located in said chassis for switching power to the individual chassis slot populated by said blade server.

6. A method for controlling a supply of power to a blade server in a blade center chassis, wherein a management module is installed in said blade center chassis, comprising the step of:
    transferring to said management module physical and logical control of electrical power connections switched to a blade server populating a chassis slot of said blade center chassis;
    wherein said blade server populates a plurality of chassis slots when installed in said blade center chassis.

7. A blade center chassis apparatus comprising:
    a plurality of chassis slots for receiving blade servers;
    a management module;
    a power supply common to said plurality of chassis slots for powering a plurality of blade servers populating said plurality of chassis slots; and
    circuitry built into said chassis for individually switching power to each of said plurality of chassis slots populated by a blade server, wherein when said blade server is removed from said chassis slot, said circuitry remains operable in said chassis.

8. The apparatus of claim 7, wherein said management module further comprises circuitry for physical and logical control over circuitry located in said chassis for individually switching power to each of said plurality of chassis slots populated by a blade server.

9. The apparatus of claim 7, wherein said management module further comprises circuitry for physical and logical control over power switching circuitry located on said blade server.

10. A blade server comprising a service processor for communications and resource management functions, wherein said service processor further comprises:
    circuitry enabled for relinquishing to a blade center management module physical and logical control over power switching circuitry for switching power to a blade server; and
    circuitry enabled for reasserting, in response to a timeout in communications with said management module, physical and logical control to said blade server over power switching circuitry for switching power to said blade server.

11. The blade server of claim 10, further comprising circuitry for logically uninterruptible power connections between
    circuitry located in a blade center chassis for switching power to the individual chassis slot populated by said blade server, and
    circuitry enabled for data processing functions comprising a CPU, memory, and a local bus.

12. The blade server of claim 10, wherein said power switching circuitry for switching power to said blade server is located on said blade server.

* * * * *